United States Patent [19]

Sugimoto

[11] Patent Number: 5,019,821

[45] Date of Patent: May 28, 1991

[54] BIAS CIRCUIT FOR A SUBRANGING ANALOG TO DIGITAL CONVERTER

[75] Inventor: Yasuhiro Sugimoto, Yokohama, Japan

[73] Assignee: Kabushiki Kaisha Toshiba, Kawasaki, Japan

[21] Appl. No.: 447,413

[22] Filed: Dec. 7, 1989

[30] Foreign Application Priority Data

Dec. 8, 1988 [JP] Japan ................................. 63-310702

[51] Int. Cl.$^5$ ........................................... H03M 1/14
[52] U.S. Cl. .................................... 341/156; 323/312; 341/118
[58] Field of Search ................ 341/118, 156; 323/312, 323/316

[56] References Cited

U.S. PATENT DOCUMENTS

| | | | |
|---|---|---|---|
| 4,680,535 | 7/1987 | Talmor | 323/312 |
| 4,745,393 | 5/1988 | Tsukada et al. | 341/156 |
| 4,808,907 | 2/1989 | Main | 323/312 |

OTHER PUBLICATIONS

Technical Report of the Electronic Information Communication Society of Japan, pp. 13–17, "Two Step Parallel ADC with Peripheral Analog and Digital Circuit" (Sep. 1987).

Primary Examiner—A. D. Pellinen
Assistant Examiner—Marc S. Hoff
Attorney, Agent, or Firm—Banner, Birch, McKie & Beckett

[57] ABSTRACT

Through first and second external terminals, fixed potentials are applied to both ends of a first ladder resistor network. A second ladder resistor network is connected at one end to a second transistor. The first external terminal is connected to a first transistor through a resistor, the resistor and the resistors of the first and second ladder resistor networks being of the same kind. A positive input terminal of an operational amplifier is connected to a node between the resistor and the first transistor. A negative input terminal of the amplifier receiving a reference voltage is connected to the second external terminal. The first and second transistors are driven by the output signal of the amplifier. The amplifier cooperates with the first transistor such that a potential at the node is equal to the potential of the reference voltage. As a result, a current flowing through the resistor is proportional to a current flowing through the first ladder resistor network. Since the current, which is based on the operation of the second transistor, flows into the second ladder resistor network, the current flowing through the first transistor is proportional to a current flowing through the second ladder resistor network.

11 Claims, 3 Drawing Sheets

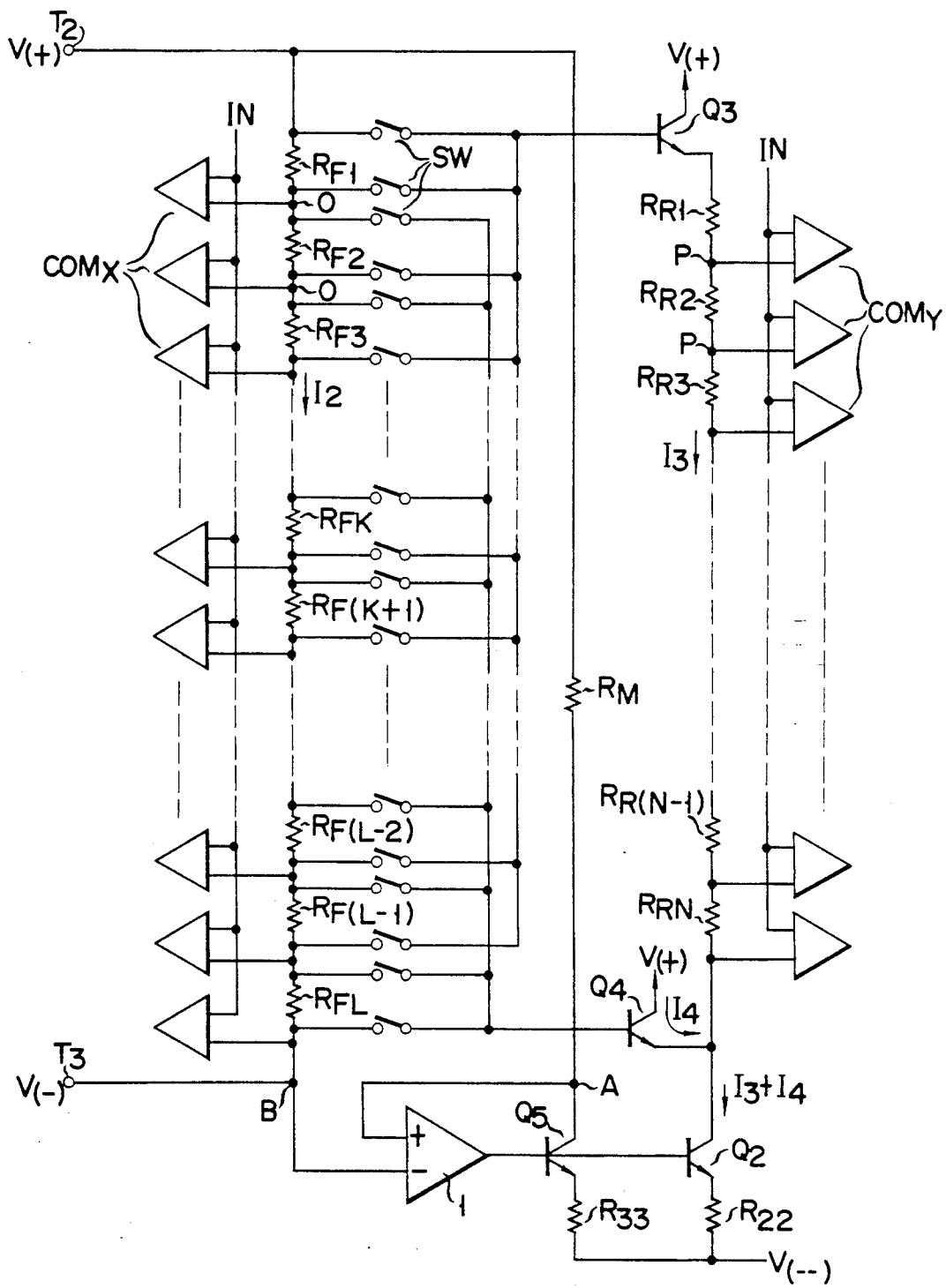
F I G. 2

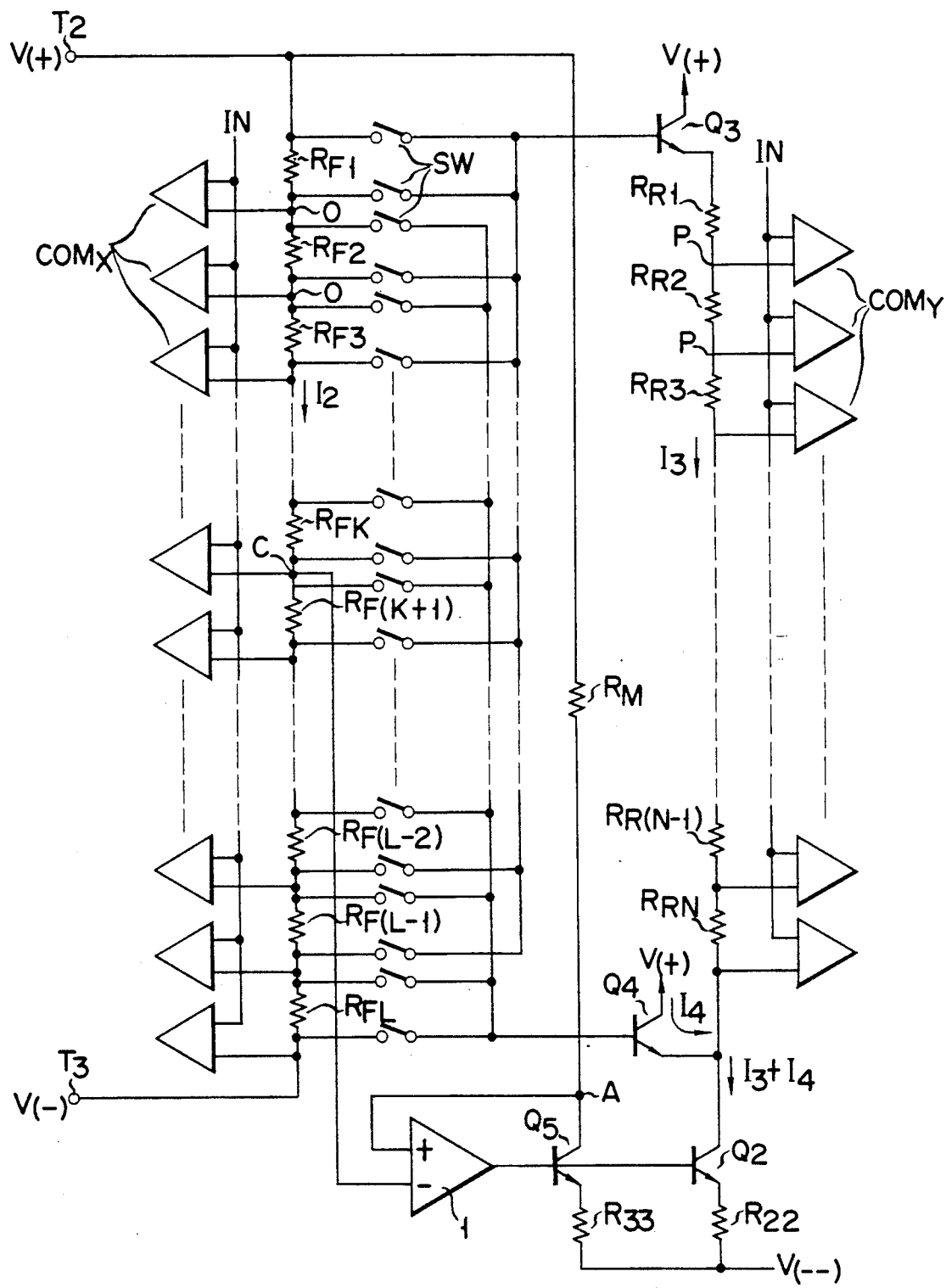
F I G. 3

BIAS CIRCUIT FOR A SUBRANGING ANALOG TO DIGITAL CONVERTER

BACKGROUND OF THE INVENTION

1. Field of the Invention

The present invention relates to a bias circuit as a reference voltage generator for use with a subranging or two step parallel analog to digital (A/D) converter.

2. Description of the Related Art

In the A/D conversion of an image signal, the conversion speed must be extremely high. The high speed A/D converters currently used are parallel A/D converters, subranging A/D converters, and the like.

It is said that for reproduction of a normal image, 6 bits of a resolution of the A/D converter provide a reproduced image of a tolerable quality, and 7 bits of the resolution provide a reproduced image of a satisfactory quality. At present, the 7-bit resolution of the A/D converter is predominantly employed in the broadcasting system, but high resolution A/D converters of 9 to 10 bits have gradually increased their share of the A/D converters now marketed.

To realize a high precision A/D converter having a resolution of 9 to 10 bits, use of a parallel A/D converter is impractical, because the required number of components, such as comparators and resistors, is increased. The subranging A/D converter may be simplified in circuit construction. In this respect, the subranging A/D converter is suitable for realizing the high precision A/D converter.

Such a subranging A/D converter is discussed by Sugiyama et al. (including the inventor of the present invention) in their paper entitled "Two Step Parallel ADC with Peripheral Analog and Digital Circuit", Technical Report of the Electronic Information Communication Society of Japan, Sept. 22, 1987, pp 13 to 17. In the A/D converter, an analog input signal is compared with the potentials between adjacent resistors of the ladder resistors of a first ladder resistor network (these resistors are connected in series and for generating reference voltages), to thereby determine the upper order bits of a digital value. Then, a potential within a fixed range within which the analog input signal exists is transferred to a second ladder resistor network through analog switches, to thereby determine the lower order bits of the digital value. Thus, it may have the ladder resistors of the second ladder resistor network for common use. Accordingly, the circuit construction of the A/D converter may be simplified.

The A/D converter disclosed in the paper, as shown in FIG. 1, is made up of a first ladder resistor network having resistors $R_{FO}$ to $R_{FL}$, a second ladder resistor network having resistors $R_{RI}$ to $R_{RN}$, analog switches SW for transferring potential within the fixed rang from the first ladder resistor network to the second ladder resistor network, transistors $Q_3$ and $Q_4$ for transferring the potential transferred through the switches SW to the second ladder resistor network, comparators $COM_X$ for determining the upper order bits of a digital value, and comparators $COM_Y$ for determining the lower order bits.

To arrange an actual subranging A/D converter, a bias circuit must be coupled with the first and second ladder resistor networks. The bias circuit, as shown in FIG. 1, includes a diode D and transistors $Q_1$ and $Q_2$, which make up a mirror circuit, resistors $R_{00}$ to $R_{22}$, an external terminal $T_1$ of the IC chip, an externally coupled resistor $R_{EX}$, and voltage sources $V_{(++)}$ and $V_{(+)}$.

In the subranging A/D converter thus arranged, the comparators $COM_X$ and the first ladder resistor network cooperate to coarsely detect a potential of an analog input signal. The voltage across the ladder resistor located between a comparator $COM_X$ producing a first logic level and a comparator $COM_X$ producing a second logic level, is transferred to the second ladder resistor network, by way of paired switches SW and the transistors $Q_3$ and $Q_4$. The comparators $COM_Y$ and the second ladder resistor network cooperate to finely detect the transferred potential.

In the circuit arrangement shown in FIG. 1, to exactly transfer the potential across the ladder resistor $R_F$, that is selected from among the resistors of the first ladder resistor network, to the second ladder resistor network, the following two conditions must be satisfied.

(1) $I_3 = I_4$ (The base-emitter voltage $V_{BEQ3}$ of the transistor $Q_3$ = base-emitter voltage $V_{BEQ4}$ of the transistor $Q_4$)

where $I_3$: current flowing through the resistors of the second ladder resistor network, and $I_4$: current flowing through a collector-emitter path of the transistor $Q_4$.

(2) $I_3 \times N \times R_R = I_2 \times R_F$ where

N : number of the second ladder resistors, $R_R$: resistance of each second ladder resistor $R_F$: resistance of each first ladder resistor.

Accordingly, the current condition is given by $I_3 = I_4 = (R_F/NR_R)I_2$.

A potential difference $I_2 \times R_F$, that is transferred from the first ladder resistor network to the second ladder resistor network, is determined by the following facts: 1) the reference current I1 is determined by the externally connected resistor $R_{EX}$, 2) the current $I_2$ varies with a variation of the power source voltage, and 3) the ladder resistors $R_F$ are not uniform in resistance, and have a temperature dependency. The variation of the potential difference is undesirable, because it leads to a variation in the dynamic range of the A/D converter, i.e., the voltage range within which the A/D conversion of an analog input signal is allowed.

SUMMARY OF THE INVENTION

Accordingly, an object of the present invention is to provide a bias circuit (reference voltage generator) for a subranging A/D converter which minimizes a variation of the dynamic range.

To achieve the above object, there is provided a bias circuit for a subranging A/D converter of the type in which a potential between the adjacent resistors of a first ladder resistor network is compared with an analog input voltage, thereby to determine the upper order bits of a digital value, and a potential within a fixed range within which the analog input signal value exists is transferred through analog switches and transistors to the ladder resistors of a second ladder resistor network, thereby to determine the lower order bits of the digital value, comprising: first and second voltage input terminals for supplying fixed potentials to the ends of the first ladder resistor network; an operational amplifier having first and second input terminals and an output terminal, the first input terminal receiving a reference voltage of a predetermined potential; a first current source connected to the output terminal of the operational amplifier, and being controlled by the operational amplifier; resistor means connected between the first voltage input terminal and the first current source, a node between the resistor means and the first current source being connected to the second input terminal of the operational amplifier, and the operational amplifier and the first current source operating so that the potential applied to the second input terminal is equal to the reference voltage, and that a current flowing through the resistor means is proportional to a current flowing through the resistors of the first ladder resistor network; and a second current source connected between the resistors of the second ladder resistor network and the output terminal of the operational amplifier, for operating, under control of the output signal of the operational amplifier, such that a current proportional to the current flowing through the resistor means flows into the resistors of the second ladder resistor network, the resistors of the first ladder resistor network, the resistors of the second ladder resistor network, and the resistor means being of the same kind.

In other words, a bias circuit for subranging A/D converter, according to the present invention, comprises: first means (including resistor means, operational amplifier, and first current source) for generating a current proportional to a current flowing through a first ladder resistor network, which are externally applied with voltages; and second means (including a second current source) for feeding a current proportional to the proportional current generated by the first means to a second ladder resistor network.

The present invention has the following advantageous features. A voltage across each of the resistors of the first ladder resistor network is fixed. The resistors of the first and second ladder resistor networks are of the same kind. The voltage generated across each of the resistors of the first ladder resistor network is free from the nonuniform resistance values of the ladder resistors and the temperature variation. The currents flowing through the first and second ladder resistor networks are proportionally related with one another (in other words, those currents vary at the same rate). The currents of the transistors, which serve to transfer the voltage to the second ladder resistor network, can be kept equal to each other.

With the above advantageous features, the voltage can exactly be transferred from the first ladder resistor network to the second ladder resistor network. The transferred voltage is free from the nonuniformity in the resistance values of the ladder resistors, and the temperature variation. Therefore, a variation of the dynamic range of the A/D converter is minimized.

BRIEF DESCRIPTION OF THE DRAWINGS

FIG. 2 is a circuit diagram of a bias circuit for a subranging A/D converter according to a first embodiment of the present invention; and FIG. 3 is a circuit diagram of a bias circuit for a subranging A/D converter according to a second embodiment of the present invention.

DETAILED DESCRIPTION OF THE PREFERRED EMBODIMENTS

Figure 1:
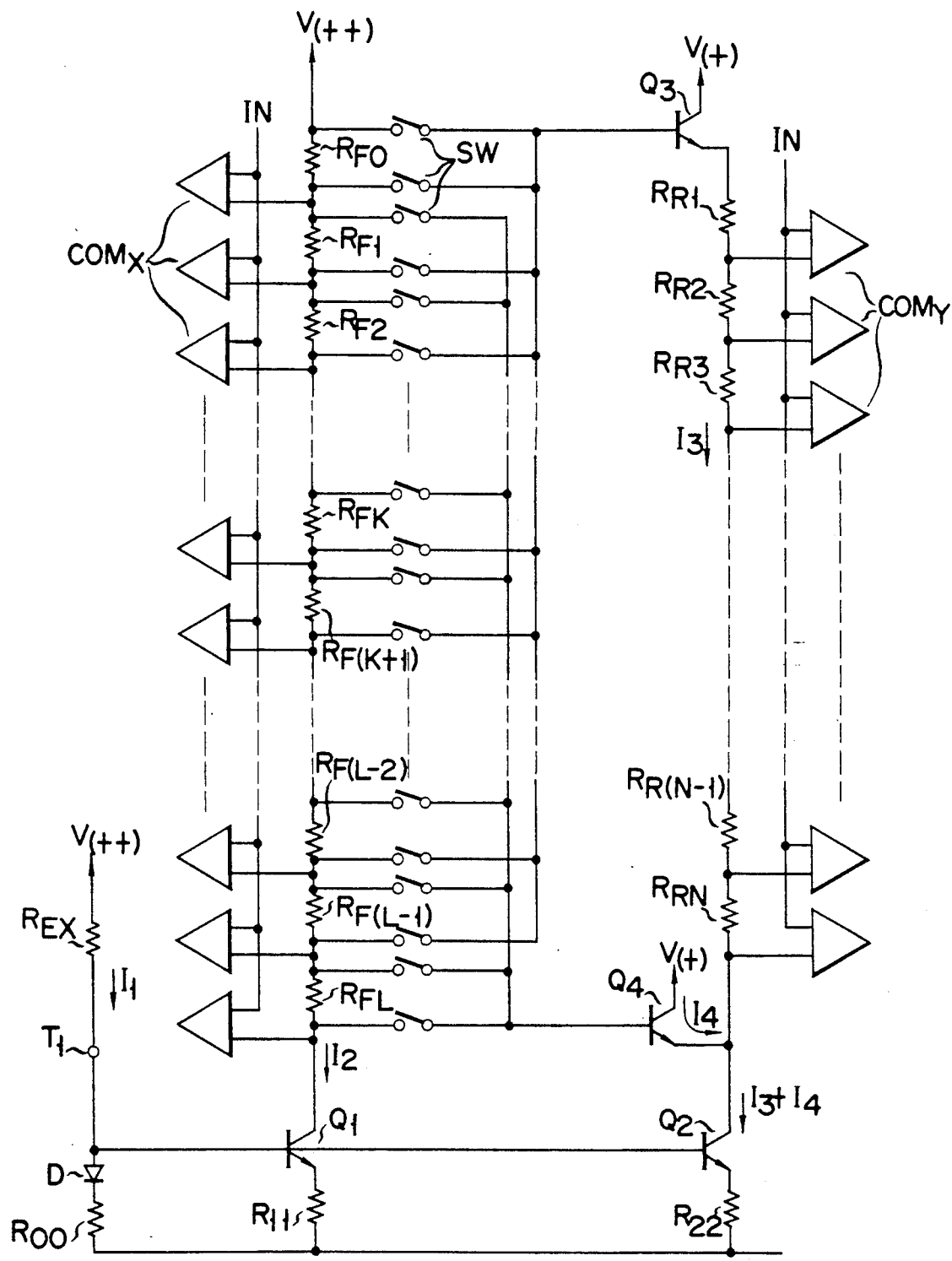
FIG. 1 is a circuit diagram of a bias circuit for a conventional subranging A/D converter.

A first embodiment of the present invention will be described with reference to FIG. 2. A first ladder resistor network having "L" ladder resistors $R_{FI}$ to $R_{FN}$ connected in series, is provided with respective first and second external terminals $T_2$ and $T_3$. The first external terminal $T_2$ applies a fixed voltage $V_{(+)}$, e.g., 5 V, to the first ladder resistor network. The second external terminal $T_3$ applies another fixed voltage $V_{(-)}$, e.g., 3 V, to the first ladder resistor network. A node "O" between the adjacent ladder resistors $R_{FI}$ to $R_{FL}$ of the first ladder resistor network is connected to a corresponding one of comparators $COM_X$. The comparator $COM_X$ compares a potential at the node "O" with an input analog voltage. Through the comparison operation, comparators $COM_X$ determine the upper order bits of a digital value. Nodes "O" are respectively connected through analog switches SW to the bases of transistors $Q_3$ and $Q_4$. The collectors of the transistors $Q_3$ and $Q_4$ are connected to the fixed potential point $V_{(+)}$. The emitters of transistors $Q_3$ and $Q_4$ are respectively connected to the ends of a second ladder resistor network having "N" ladder resistors $R_{RI}$ to $R_{RN}$, which are connected in series. A node "P" between the adjacent ladder resistors $R_{RI}$ to $R_{RN}$ of the second ladder resistor network is connected to a corresponding one of comparators $COM_Y$. The comparator $COM_Y$ compares a potential which are connected in series. A node "P" between the at the node "P" with an input analog voltage. Through the comparison operation, comparators $COM_Y$ determine the lower order bits of a digital value. The emitter of the transistor $Q_4$ is connected to a fixed potential point $V_{(--)}$, e.g., ground point, through a collector-emitter path of a transistor $Q_2$ as a current source, and a resistor $R_{22}$. The numbers L and N of the ladder resistors are determined by the number of bits of the A/D converter.

The first external terminal $T_2$ is connected to the fixed potential point $V_{(--)}$, through a resistor $R_M$, the collector-emitter current path of a transistor $Q_5$, and a resistor $R_{33}$. A node A between the resistor $R_M$ and the collector of the transistor $Q_5$, is connected to a positive input terminal of an operational amplifier 1. A negative input terminal of the operational amplifier 1, which is for receiving the voltage $V_{(-)}$ as a reference voltage, is connected to a node B between the second external terminal $T_3$ and the ladder resistor $R_{FL}$. The output terminal of the operational amplifier 1 is connected to the bases of the transistors $Q_2$ and $Q_5$.

The ladder resistors $R_{FI}$ to $R_{FL}$ of the first ladder resistor network and the ladder resistors $R_{RI}$ to $R_{RN}$ of the second ladder resistor network and the resistor $R_M$ are of the same kind, viz., made of materials which are of the same quality and temperature characteristic.

Accordingly, the operational amplifier 1 cooperates with the transistor $Q_5$ connected to its output, to keep a potential at the node A at the reference voltage $V_{(-)}$. A current $I_2/M$ (M = constant) flowing through the resistor $R_M$ is proportional to a current $I_2$ flowing through the ladder resistors $R_{FI}$ to $R_{FL}$ of the first ladder resistor network.

The transistors $Q_2$ and $Q_5$ serving as the current sources are driven by the output signal of the operational amplifier 1. Further, the current based on the operation of the transistor $Q_2$ flows into the ladder resistors $R_{RI}$ to $R_{RN}$ of the second ladder resistor network. A current corresponding to $I_2/M$) flowing through the collector-emitter current path of the transistor $Q_5$ is proportional to the current $I_3$ flowing into the ladder resistors $R_{RI}$ to $R_{RN}$.

In the circuit arrangement of FIG. 2, the potentials at both the ends of the first ladder resistor network are fixed by the external power sources, as in the ordinary video A/D converter. Accordingly, in this circuit arrangement, a value of "ladder resistors of the first ladder resistor network×I₂" is kept constant irrespective of the variation in the resistance of the ladder resistors and the temperature change. In this point, this arrangement is distinguished from the arrangement of FIG. 1. Consequently, the voltage at both the ends of the first ladder resistor network, and the voltage at point B are made constant. Because the potentials at points A and B are equal to each other, the current $I_2$ is proportional to the current $I_2/M$, and the current from the current source $Q_5$ is proportional to that of the current source $Q_2$. As a consequence, the current $I_2$ is proportional to the current $I_3$.

In the arrangement of FIG. 2, to exactly transfer the potential across the first ladder resistor network to the second ladder resistor network, the following relations must hold $$I_3 = I_4, \text{ and } Ihd \ 3 \times N \times R_R = I_2 R_F = \text{constant} \quad (1)$$

where $I_4$: current flowing through the collector-emitter path of the transistor $Q_4$, N : number of the resistors of the second ladder resistor network, $R_R$: resistance of each resistor of the second of ladder resistor network, and $R_F$: resistance of each resistor of the first ladder resistor network.

Hence, $I_3$ can be rewritten into $$I_3 = (R_F/NR_R)I_2 \quad (2).$$

Where the relation (2) holds, the current $I_2$ is exactly proportional to the current $I_3$, because the resistors of the first and second ladder resistors networks are of the same kind, and $R_F/NR_R$ is constant. Therefore, the potentials between the adjacent resistors of those ladder resistors of the first ladder resistor network, and the potential applied to the resistors of the second ladder resistor network are little influenced by the variation in resistance and the temperature variation. Therefore, the dynamic range of the A/D conversion is minimized in variation.

FIG. 3 is a circuit diagram showing an arrangement of a second embodiment of the present invention. The second embodiment is featured in that the negative input terminal of the operational amplifier 1 is connected to a node C between the resistors $R_{FK}$ and $R_{F(K+1)}$ of the first ladder resistor network, and a potential at the node C is used as a reference voltage applied to the negative input terminal of the amplifier 1. Also in this case, as in the first embodiment, the operational amplifier 1 operates so that the potential at point A is equal to the reference voltage, i.e., the potential at point C. The remaining arrangement of FIG. 3 is substantially equal to that of the first embodiment. Accordingly, the operation of and the advantages attained by the second embodiment are substantially the same as those of the first embodiment.

The reference voltage may be obtained at any node of the ladder resistors $R_{FI}$ to $R_{FL}$ of the first ladder resistor network.

As described above, in a bias circuit for a subranging A/D converter according to the present invention, the voltages between the adjacent resistors of those ladder resistors of the first ladder resistor network, and the potential applied to the resistors of the second ladder resistor network are little influenced by the variation in resistance and the temperature variation. Therefore, the dynamic range of the A/D conversion is minimized in variation.

What is claimed is:

1. A bias circuit for a subranging analog to digital (A/D) converter of the type in which a potential between adjacent resistors of a first ladder resistor network is compared with an analog input voltage to determine upper order bits of a digital value, and a potential within a fixed range about the analog input signal value is transferred through analog switches and transistors to ladder resistors of a second ladder resistor network to determine lower order bits of the digital value, said bias circuit comprising:

first and second voltage input terminals for supplying respective first and second fixed potentials to first and second ends of said first resistor network;

an operational amplifier having first and second input terminals and an output terminal, the first input terminal receiving a reference voltage of a predetermined potential;

a first current source connected to the output terminal of said operational amplifier and being controlled by said operational amplifier;

a resistive element connected between said first voltage input terminal and said first current source, a node between said resistive element and said first current source being connected to the second input terminal of said operational amplifier, and said operational amplifier and said first current source operating so that the potential applied to the second input terminal of said operational amplifier is equal to the reference voltage, and that a current flowing through said resistive element is proportional to a current flowing through the resistors of said first ladder resistor network; and a second current source connected between the resistors of said second ladder resistor network and the output terminal of said operational amplifier, for operating, under control of the output signal of said operational amplifier, such that a current proportional to the current flowing through said resistive element flows into the resistors of said second ladder resistor network, wherein the resistors comprising said first ladder resistor network, said second ladder resistor network, and said resistive element are of the same kind.

2. The bias circuit according to claim 1, wherein the first input terminal of said operational amplifier is connected to said second voltage input terminal so that the first input terminal receives the second fixed potential applied to said second voltage input terminal as the reference voltage.

3. The bias circuit according to claim 2, wherein said first current source comprises a first transistor having a base, a collector, and an emitter, and the base of said first transistor is connected to the output terminal of said operational amplifier, the collector is connected to said resistive element and the second input terminal of said operational amplifier, and the emitter is connected to a third fixed potential which is lower than the first and second fixed potentials respectively applied to said first and second voltage input terminals.

4. The bias circuit according to claim 3, wherein said second current source comprises a second transistor having a base, a collector, and an emitter, and the base of said second transistor is connected to the output terminal of said operational amplifier, the collector is connected the resistors of said second ladder resistor network, and the emitter is connected to the third fixed potential.

5. The bias circuit according to claim 4, wherein the first fixed potential applied to said first voltage input terminal is higher than the second fixed potential applied to said second voltage input terminal.

6. The bias circuit according to claim 5, wherein the first input terminal of said operational amplifier is a negative input terminal and the second input terminal of said operational amplifier is a positive input terminal.

7. The bias circuit according to claim 1, wherein the first input terminal of said operational amplifier is connected between first and second adjacent resistors of said first ladder resistor network; such that the first input terminal of said operational amplifier receives a potential between the first and second fixed potentials as the reference potential.

8. The bias circuit according to claim 7, wherein said first current source comprises a first transistor having a base, a collector, and an emitter, and the base of said first transistor is connected to the output terminal of said operational amplifier, the collector is connected to said resistive element and the second input terminal of said operational amplifier, and the emitter is connected to a third fixed potential which is lower than the first and second fixed potentials respectively applied to said first and second voltage input terminals.

9. The bias circuit according to claim 8, wherein said second current source comprises a second transistor having a base, a collector, and an emitter, and the base of said second resistor is connected to the output terminal of said operational amplifier, the collector is connected to the resistors of said second ladder resistor network, and the emitter is connected to the third fixed potential.

10. The bias circuit according to claim 9, wherein the first potential applied to said first voltage input terminal is higher than the second fixed potential applied to said second voltage input terminal.

11. The bias circuit according to claim 10, wherein the first input terminal of said operational amplifier is a negative input terminal and the second input terminal of said operational amplifier is a positive input terminal.

* * * * *